United States Patent
Ryu

(10) Patent No.: US 8,325,558 B2
(45) Date of Patent: Dec. 4, 2012

(54) BLOCK DECODER OF SEMICONDUCTOR MEMORY DEVICE

(75) Inventor: Je Il Ryu, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 154 days.

(21) Appl. No.: 12/982,227

(22) Filed: Dec. 30, 2010

(65) Prior Publication Data

US 2011/0158028 A1 Jun. 30, 2011

(30) Foreign Application Priority Data

Dec. 31, 2009 (KR) .................. 10-2009-0135649

(51) Int. Cl.
*G11C 8/00* (2006.01)
(52) U.S. Cl. .......... 365/230.06; 365/230.03; 365/189.09
(58) Field of Classification Search ............. 365/230.06, 365/230.03, 189.09
See application file for complete search history.

(56) References Cited

U.S. PATENT DOCUMENTS

| | | | |
|---|---|---|---|
| 5,867,446 A * | 2/1999 | Konishi et al. ......... | 365/233.16 |
| 6,249,483 B1 * | 6/2001 | Kim ........................ | 365/233.17 |
| 7,518,942 B2 * | 4/2009 | Sunaga ................... | 365/230.06 |
| 8,208,335 B2 * | 6/2012 | Lee et al. ................ | 365/222 |
| 2002/0075746 A1 * | 6/2002 | Ooishi .................... | 365/230.03 |
| 2005/0232068 A1 * | 10/2005 | Kubo ...................... | 365/233.5 |
| 2011/0116335 A1 * | 5/2011 | Lee et al. ................ | 365/222 |

FOREIGN PATENT DOCUMENTS

| KR | 1020020038862 A | 5/2002 |
|---|---|---|
| KR | 1020040054362 A | 6/2004 |

* cited by examiner

*Primary Examiner* — Tuan T. Nguyen
(74) *Attorney, Agent, or Firm* — William Park & Associates Ltd.

(57) ABSTRACT

A block decoder of a semiconductor memory device includes a control signal generation circuit configured to output a control signal in response to a first address mixing signal, a second address mixing signal, and an enable period signal and a block selection signal generation circuit configured to generate a block selection signal for selecting a memory block in response to the control signal.

16 Claims, 3 Drawing Sheets

BLOCK DECODER OF SEMICONDUCTOR MEMORY DEVICE

CROSS-REFERENCE TO RELATED APPLICATION

Priority to Korean patent application number 10-2009-0135649 filed on Dec. 31, 2009, the entire disclosure of which is incorporated by reference herein, is claimed.

BACKGROUND

Exemplary embodiments relate to a block decoder of a semiconductor memory device and, more particularly, to a block decoder of a semiconductor memory device.

Recently, there is an increasing demand for semiconductor memory devices which can be electrically programmed and erased and which do not require the refresh function of rewriting data at specific intervals. In order to develop high-capacity memory devices capable of storing a large amount of data, research is being done on technologies for improving the degree of integration of memory devices. To this end, active research is being carried out on flash memory.

Flash memory is chiefly divided into NAND type flash memory and NOR type flash memory. The NOR type flash memory has an excellent random access time characteristic because memory cells are independently coupled to bit lines and word lines. The NAND type flash memory is excellent in terms of the degree of integration because a plurality of memory cells is coupled together in series and so each cell string requires, for example, only one contact. Accordingly, the NAND type flash memory may be used in high integration nonvolatile memory.

In general, a flash memory device includes a block decoder for selecting a memory cell array on a block basis in order to perform a program, a read, and an erase operations.

FIG. 1 is a diagram showing the arrangement of signal lines used in a block decoder circuit.

Referring to FIG. 1, a plurality of metal lines for receiving signals to control a block decoder is arranged on the side of a plurality of memory blocks (for example, 4096 memory blocks). For example, 32 metal lines XA<7;0>, XB<7;0>, XC<7;0>, and XD<7;0> are used to receive address signals to select a memory block. Here, assuming that the line width of each of the metal lines XA<7;0>, XB<7;0>, XC<7;0>, and XD<7;0> is 0.5 μm and the interval between the metal lines is 0.5 μm, a total of 32 μm space is required.

BRIEF SUMMARY

Exemplary embodiments relate to a block decoder of a semiconductor memory device, reducing the number of metal lines disposed beside a block decoder, and so reducing the area of a semiconductor memory device, by controlling the operation of the block decoder using a first address mixing signal generated by using a first address signal and a second address signal and a second address mixing signal generated by using a third address signal and a fourth address signal.

The block decoder of a semiconductor memory device according to an exemplary embodiment of the present invention includes a control signal generation circuit configured to output a control signal in response to a first address mixing signal, a second address mixing signal, and an enable period signal, and a block selection signal generation circuit configured to generate a block selection signal for selecting a memory block in response to the control signal.

The block decoder of a semiconductor memory device according to another exemplary embodiment of the present invention includes a first address activation signal generator configured to generate a first address activation signal in response to a first address mixing signal and a second address mixing signal, a second address activation signal generator configured to generate a second address activation signal in response to a first address mixing signal and a second address mixing signal, a control signal generator configured to generate a control signal in response to the first address activation signal and the second address activation signal, and a block selection signal generator configured to generate a block selection signal in response to the control signal.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
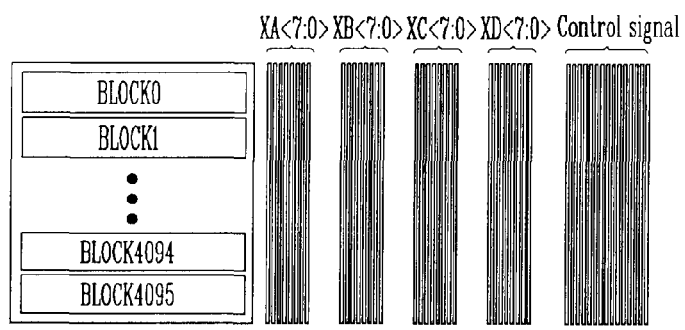
FIG. 1 is a diagram showing the arrangement of signal lines used in a block decoder circuit.
Figure 2:
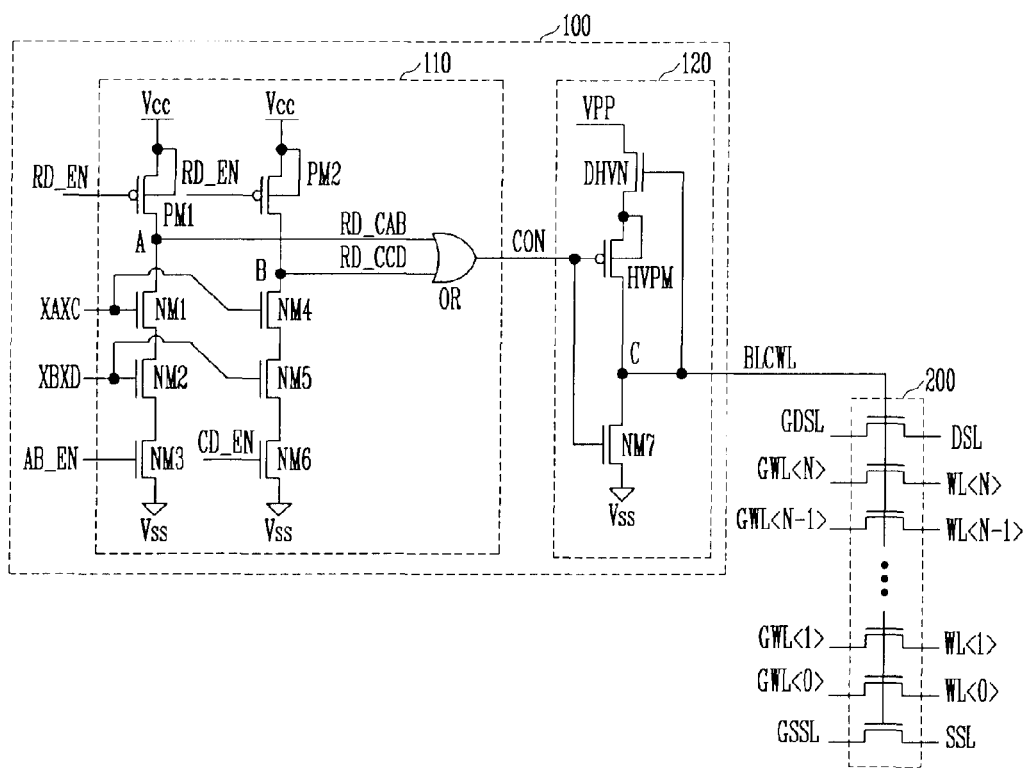
FIG. 2 is a circuit diagram illustrating a block decoder of a semiconductor memory device according to an exemplary embodiment of the present invention.

FIG. 2 is a circuit diagram illustrating a block decoder of a semiconductor memory device according to an exemplary embodiment of the present invention.

Referring to FIG. 2, the block decoder 100 includes a control signal generation circuit 110 and a block selection signal generation circuit 120.

The control signal generation circuit 110 outputs a control signal CON in response to a first address mixing signal XAXC, a second address mixing signal XBXD, an enable signal RD_EN, and a first and a second enable period signals AB_EN and CD_EN. Here, the first address mixing signal XAXC is activated in a high level when at least any one of an address signal XA and an address signal XC is activated in a high level, the second address mixing signal XBXD is activated in a high level when at least any one of an address signal XB and an address signal XD is activated in a high level. The first enable period signal AB_EN is supplied as a high level signal in the period in which the address signal XA and the address signal XB are activated, and the second enable period signal CD_EN is supplied as a high level signal in the period in which the address signal XC and the address signal XD are activated.

The block selection signal generation circuit 120 outputs a block selection signal BLCWL of a low level to a pass circuit 200 when a corresponding memory block is not selected. On the other hand, the block selection signal generation circuit 120 outputs the block selection signal BLCWL of a high level to the pass circuit 200 when a corresponding memory block is selected.

The control signal generation circuit 110, according to an example, includes a plurality of NMOS transistors NM1 to NM6, PMOS transistors PM1 and PM2, and an OR gate OR.

The PMOS transistor PM1 is coupled between a power supply Vcc and a first node A, and configured to supply the voltage of the power supply Vcc to the first node A in response to the enable signal RD_EN. The NMOS transistors NM1 to NM3 are coupled in series between the first node A and a ground. The NMOS transistors NM1 to NM3 supply the voltage of the ground Vss (a ground voltage Vss) to the first node A in response to the first address mixing signal XAXC, the second address mixing signal XBXD, and the first enable period signal AB_EN. That is, when all the first address mixing signal XAXC, the second address mixing signal XBXD, and the first enable period signal AB_EN are activated in a high level, the NMOS transistors NM1 to NM3 supply the ground voltage Vss to the first node A. The PMOS transistor PM2 is coupled between the power supply Vcc and a second node B, and configured to supply the voltage of the power supply Vcc to the second node B in response to the enable signal RD_EN. The NMOS transistors NM4 to NM6 are coupled in series between the second node B and the ground. The NMOS transistors NM4 to NM6 supply the ground voltage Vss to the second node B in response to the first address mixing signal XAXC, the second address mixing signal XBXD, and the second enable period signal CD_EN. That is, when all the first address mixing signal XAXC, the second address mixing signal XBXD, and the second enable period signal CD_EN are activated in a high level, the NMOS transistors NM4 to NM6 supply the ground voltage Vss to the second node B. The OR gate OR outputs the control signal CON in response to an output of the node A RD_CAB and an output of the node B RD_CCD. That is, when both the output of the node A RD_CAB and the output of the node B RD_CCD are in a low level, the OR gate OR outputs the control signal CON of a low level.

The block selection signal generation circuit 120 includes a depletion high voltage NMOS transistor DHVN, a high voltage PMOS transistor HVPM, and an NMOS transistor NM7. The depletion high voltage NMOS transistor DHVN and the high voltage PMOS transistor HVPM are coupled in series between a high voltage power supply VPP and an output node C. The high voltage PMOS transistor HVPM is turned on in response to the control signal CON, and the depletion high voltage NMOS transistor DHVN controls the current supplied from the high voltage power supply VPP according to a potential of the output node C. The depletion high voltage NMOS transistor DHVN is characterized in that a threshold voltage of the transistor usually has a negative value. Therefore, although voltage of 0 V is supplied to the gate of the depletion high voltage NMOS transistor DHVN, current may flow through the depletion high voltage NMOS transistor DHVN. The depletion high voltage NMOS transistor DHVN may have the threshold voltage of the negative value even though its threshold voltage is increased by the body effect. The NMOS transistor NM7 is coupled between the output node C and the ground Vss, and configured to supply the ground voltage Vss to the output node C in response to the control signal CON.

When the control signal generation circuit 110 outputs the control signal CON of a high level, the high voltage PMOS transistor HVPM is turned off, and so the supply of a voltage of the high voltage power supply VPP (a high voltage Vpp) to the output node C is cut off. In this case, the NMOS transistor NM7 is turned on, and so the ground voltage Vss is supplied to the output node C, thereby discharging the output node C. Consequently, the block selection signal BLCWL of the ground voltage (Vss) level is output.

On the other hand, when the control signal generation circuit 110 outputs the control signal CON of a low level, the NMOS transistor NM7 is turned off, and so the supply of the ground voltage Vss to the output node C is cut off. The high voltage PMOS transistor HVPM is turned on, and so the high voltage VPP is supplied to the output node C. Consequently, the block selection signal BLCWL of a high voltage (VPP) level is output.

Figure 3:
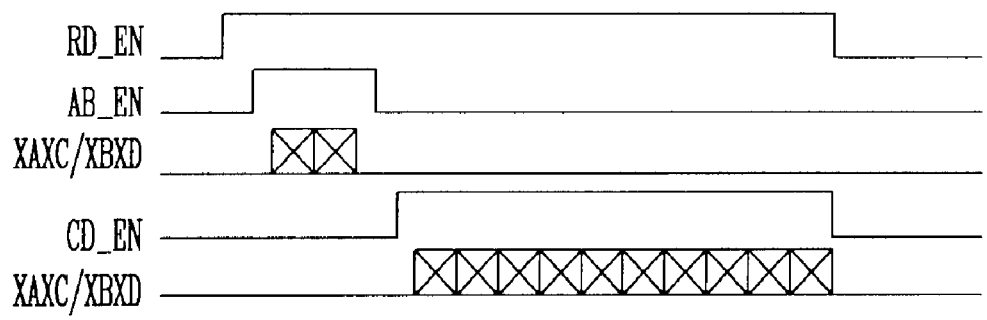
FIG. 3 shows a waveform of signals, illustrating the operation of the block decoder of the semiconductor memory device according to the exemplary embodiment of the present invention.

FIG. 3 shows a waveform of signals, illustrating the operation of the block decoder of the semiconductor memory device according to the exemplary embodiment of the present invention.

Referring to FIGS. 2 and 3, the enable signal RD_EN supplied as a low level signal shifts to a high level, and so the PMOS transistors PM1 and PM2 of the control signal generation circuit 110 are turned off. Accordingly, the supply of the voltage of the power supply Vcc to the first node A and the second node B is cut off.

The first enable period signal AB_EN, supplied as a high level signal in the period in which the address signal XA and the address signal XB are activated, is activated in a high level. Here, if the address signal XA and the address signal XB correspond to a certain memory block, the address signal XA and the address signal XB are activated in a high level. In response thereto, the first and second address mixing signals XAXC and XBXD are activated in a high level. Accordingly, the first node A is supplied with the ground voltage Vss, thus outputting the output of the node A RD_CAB of a low level.

On the other hand, if the address signal XA and the address signal XB do not correspond to a pertinent memory block, the first and second address mixing signals XAXC and XBXD are supplied as a low level signal. Accordingly, the first node A outputs the output of the node A RD_CAB of a high level because the first node A has been precharged to a high level by the power supply Vcc.

Next, the second enable period signal CD_EN, supplied as a high level signal in the period in which the address signal XC and the address signal XD are activated, is activated in a high level. Here, if the address signal XC and the address signal XD correspond to a pertinent memory block, the address signal XC and the address signal XD are activated in a high level. In response thereto, the first and second address mixing signals XAXC and XBXD are activated in a high level. Accordingly, the second node B is supplied with the ground voltage Vss, thus outputting the output of the node B RD_CCD of a low level.

On the other hand, if the address signal XC and the address signal XD do not correspond to a pertinent memory block, the first and second address mixing signals XAXC and XBXD are supplied as a low level signal. Accordingly, the second node B outputs the output of the node B RD_CCD of a high level because the second node B has been precharged to a high level by the power supply Vcc.

The OR gate OR of the control signal generation circuit 110 outputs the control signal CON by logically combining the output of the node A RD_CAB and the output of the node B RD_CCD. That is, when all the address signals XA, XB, XC, and XD are activated in a high level, the first and second mixing signals XAXC and XBXD are activated in a high level in the period in which the first enable period signal AB_EN is activated and the period in which the second enable period signal CD_EN is activated, and so the control signal CON of a low level is output.

When the control signal generation circuit 110 outputs the control signal CON of a high level, the high voltage PMOS transistor HVPM is turned off, and so the supply of the high voltage VPP to the output node C is cut off. In this case, the NMOS transistor NM7 is turned on, and so the ground voltage Vss is supplied to the output node C, thereby discharging the output node C. Accordingly, the block selection signal BLCWL of the ground voltage (Vss) level is output. On the other hand, when the control signal generation circuit 110 outputs the control signal CON of a low level, the NMOS transistor NM7 is turned off, and so the supply of the ground voltage Vss to the output node C is cut off. The high voltage PMOS transistor HVPM is turned on, and so the high voltage VPP is supplied to the output node C. Accordingly, the block selection signal BLCWL of the high voltage (VPP) level is output.

Figure 4:
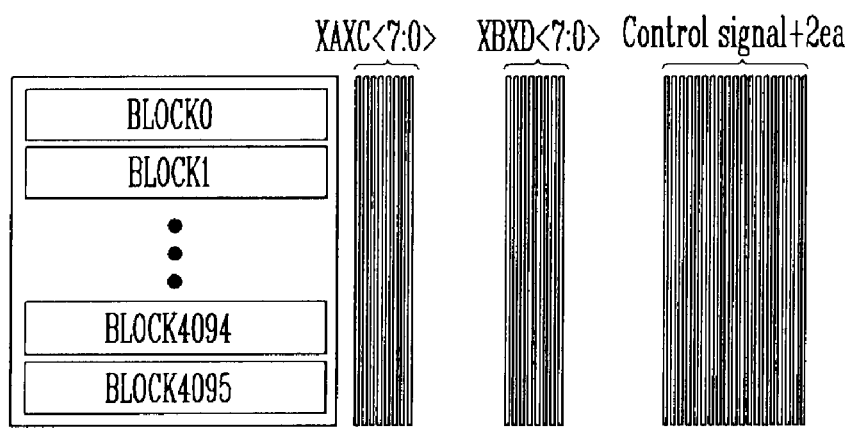
FIG. 4 is a diagram showing the arrangement of signal lines used in the block decoder circuit according to the exemplary embodiment of the present invention.

FIG. 4 is a diagram showing the arrangement of signal lines used in the block decoder circuit according to the exemplary embodiment of the present invention.

As shown in FIG. 4, the area in which signal lines are disposed may decrease by using the first and second address mixing signals XAXC<7;0> and XBXD<7;0> and the first and second enable period signals AB_EN and CD_EN, instead of address signals XA<7;0>, XB<7;0>, XC<7;0>, and XD<7;0>.

Figure 5:
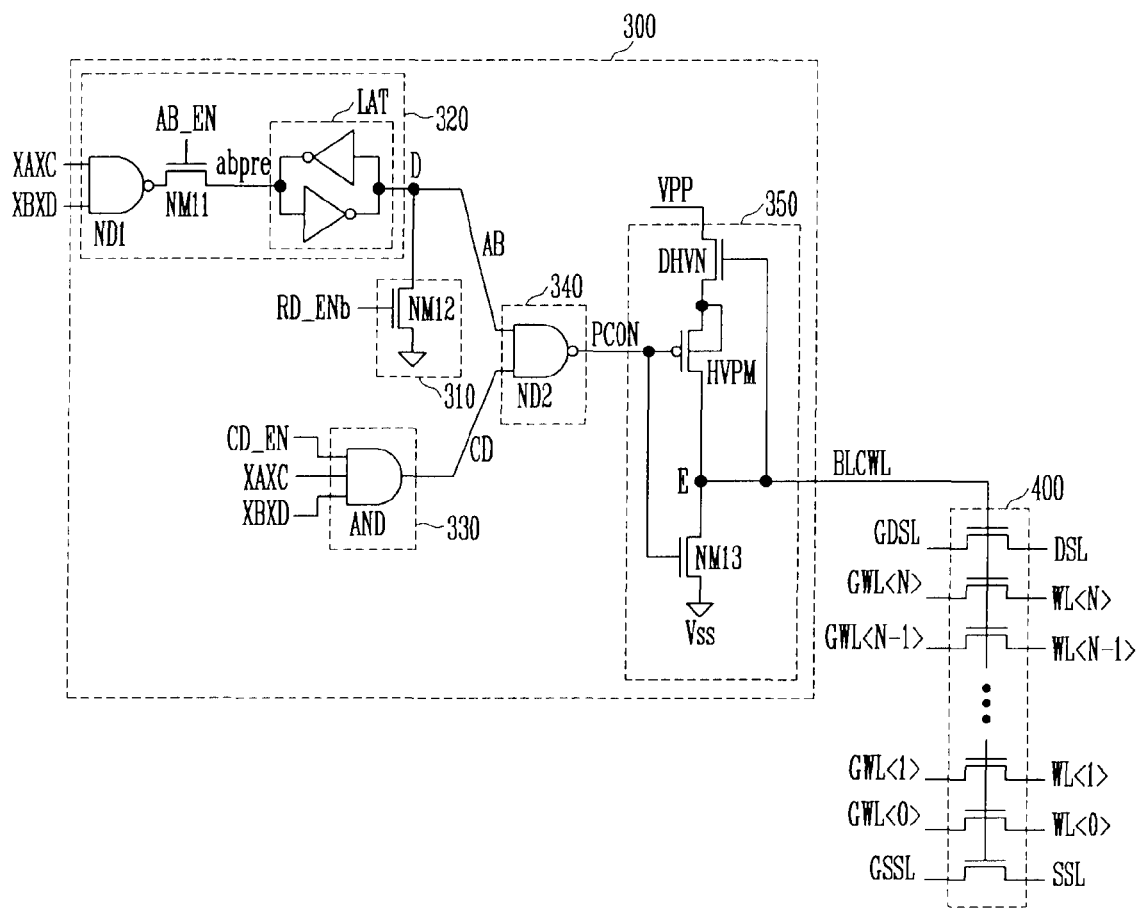
FIG. 5 is a circuit diagram illustrating a block decoder of a semiconductor memory device according to another exemplary embodiment of the present invention.

FIG. 5 is a circuit diagram illustrating a block decoder of a semiconductor memory device according to another exemplary embodiment of the present invention.

Referring to FIG. 5, the block decoder 300 includes a reset unit 310, a first address activation signal generator 320, a second address activation signal generator 330, a control signal generator 340, and a block selection signal generator 350.

The reset unit 310 resets a first address activation signal AB to a low level in response to an enable signal RD_ENb.

The first address activation signal generator 320 generates first address activation signal AB in response to a first address mixing signal XAXC activated in a high level when at least any one of an address signal XA and an address signal XC is activated in a high level, a second address mixing signal XBXD activated in a high level when at least any one of an address signal XB and an address signal XD is activated in a high level, and a first enable period signal AB_EN supplied as a high level signal in the period in which the address signal XA and the address signal XB are activated.

The second address activation signal generator 330 generates a second address activation signal CD in response to the first address mixing signal XAXC, the second address mixing signal XBXD, and a second enable period signal CD_EN.

The control signal generator 340 generates a control signal PCON in response to the first address activation signal AB and the second address activation signal CD.

In response to the control signal PCON, the block selection signal generation circuit 350 outputs a block selection signal BLCWL of a low level to a pass circuit 400 when a corresponding memory block is not selected, and outputs the block selection signal BLCWL of a high level to the pass circuit 200 when a corresponding memory block is selected.

The reset unit 310 includes an NMOS transistor N12 coupled in series between a ground Vss and the output node D of the first address activation signal generator 320. The NMOS transistor N12 supplies a voltage of the ground Vss (a ground voltage Vss) to the output node D in response to the enable signal RD_ENb, thus resetting the first address activation signal AB to a low level.

The first address activation signal generator 320 includes a NAND gate ND1, an NMOS transistor NM11, and a latch LAT. The NAND gate ND1 generates an output signal by logically combining the first address mixing signal XAXC and the second address mixing signal XBXD. The NMOS transistor NM11 is coupled between the NAND gate ND1 and the latch LAT. The NMOS transistor NM11 transmits the output signal of the NAND gate ND1 to the latch LAT as a first address pre-signal abpre in response to the first enable period signal AB_EN. The latch LAT temporarily stores the first address pre-signal abpre, inverts it, and outputs the inverted signal as the first address activation signal AB. The first address activation signal generator 320 generates the first address activation signal AB of a high level when all the first address mixing signal XAXC, the second address mixing signal XBXD, and the first enable period signal AB_EN are activated in a high level.

The second address activation signal generator 330 includes an AND gate AND. The AND gate AND outputs the second address activation signal CD by logically combining the first address mixing signal XAXC, the second address mixing signal XBXD, and the second enable period signal CD_EN. That is, the second address activation signal generator 330 outputs the second address activation signal CD of a high level when all the first address mixing signal XAXC, the second address mixing signal XBXD, and the second enable period signal CD_EN are in a high level.

The control signal generator 340 includes an NAND gate ND2. The NAND gate ND2 outputs the control signal PCON by logically combining the first address activation signal AB and the second address activation signal CD. That is, the control signal generator 340 outputs the control signal PCON of a low level when both the first address activation signal AB and the second address activation signal CD are in a high level.

The block selection signal generator 350 includes a depletion high voltage NMOS transistor DHVN, a high voltage PMOS transistor HVPM, and an NMOS transistor NM13. The depletion high voltage NMOS transistor DHVN and the high voltage PMOS transistor HVPM are coupled in series between a high voltage power supply VPP and an output node E. The high voltage PMOS transistor HVPM is turned on in response to the control signal PCON. The depletion high voltage NMOS transistor DHVN controls the current supplied from the high voltage power supply VPP according to a potential of the output node E. The depletion high voltage NMOS transistor DHVN is characterized in that a threshold voltage of the transistor usually has a negative value. Therefore, although voltage of 0 V is supplied to the gate of the depletion high voltage NMOS transistor DHVN, current may flow through the depletion high voltage NMOS transistor DHVN. The depletion high voltage NMOS transistor DHVN may have the threshold voltage of the negative value even though its threshold voltage is increased by the body effect. The NMOS transistor NM13 is coupled between the output node E and the ground Vss, and configured to supply the ground voltage Vss to the output node E in response to the control signal CON.

When the control signal generator 340 outputs the control signal PCON of a high level, the high voltage PMOS transistor HVPM is turned off, and so the supply of the voltage of the high voltage power supply VPP (a high voltage Vpp) to the output node E is cut off. In this case, the NMOS transistor NM13 is turned on, and so the ground voltage Vss is supplied to the output node E, thereby discharging the output node E.

Accordingly, the block selection signal BLCWL of the ground voltage (Vss) level is output. On the other hand, when the control signal generation circuit 340 outputs the control signal PCON of a low level, the NMOS transistor NM13 is turned off, and so the supply of the ground voltage Vss to the output node E is cut off. The high voltage PMOS transistor HVPM is turned on, and so the high voltage VPP is supplied to the output node E. Accordingly, the block selection signal BLCWL of a high voltage (VPP) level is output.

Figure 6:
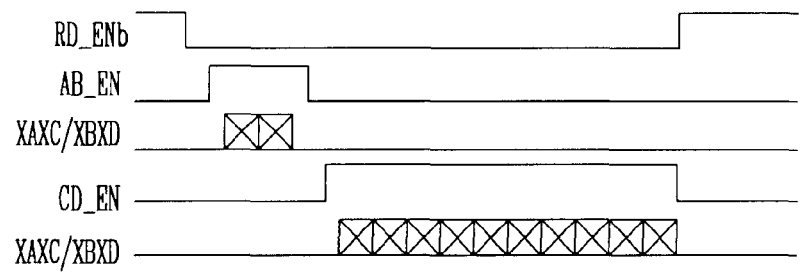
FIG. 6 shows a waveform of signals, illustrating the operation of the block decoder of the semiconductor memory device according to the another exemplary embodiment of the present invention.

FIG. 6 shows a waveform of signals, illustrating the operation of the block decoder of the semiconductor memory device according to the another exemplary embodiment of the present invention.

Referring to FIGS. 5 and 6, the enable signal RD_ENb supplied to the reset unit 310 as a high level signal shifts to a low level, and it is supplied to the reset unit 310. Thus, the supply of the ground voltage Vss to the output node D of the first address activation signal generator 320 is cut off.

The first enable period signal AB_EN supplied as a high level signal in the period in which the address signal XA and the address signal XB are activated shifts to a high level. In response thereto, the NMOS transistor NM11 is turned on. Here, in case where the address signal XA and the address signal XB correspond to a certain memory block, the address signal XA and the address signal XB are activated in a high level. Thus, the first and second address mixing signals XAXC and XBXD are activated in a high level. The NAND gate ND1 generates the output signal of a low level. In response thereto, the first address pre-signal abpre of a low level is inputted to the latch LAT. Accordingly, the latch LAT outputs the first address activation signal AB of a high level. Here, since the latch LAT receives and stores the first address pre-signal abpre, it outputs the first address activation signal AB although the period in which the first enable period signal AB_EN is activated is finished.

The activation period of the first enable period signal AB_EN is finished, and the second enable period signal CD_EN is activated in a high level. Here, the second address activation signal generator 330 outputs the second address activation signal CD in response to the second enable period signal CD_EN, the first address mixing signal XAXC, and the second address mixing signal XBXD. Here, when both the first address mixing signal XAXC and the second address mixing signal XBXD are in a high level, the second address activation signal generator 330 outputs the second address activation signal CD of a high level.

The control signal generator 340 outputs the control signal PCON by logically combining the first address activation signal AB and the second address activation signal CD. That is, the control signal generator 340 outputs the control signal PCON of a low level when both the first address activation signal AB and the second address activation signal CD are in a high level.

When the control signal generator 340 outputs the control signal PCON of a high level, the high voltage PMOS transistor HVPM is turned off and so the supply of the high voltage VPP to the output node E is cut off. The NMOS transistor NM13 is turned on, and so the ground voltage Vss is supplied to the output node E, thereby discharging the output node E. Accordingly, the block selection signal generator 350 outputs the block selection signal BLCWL of the ground voltage (Vss) level. On the other hand, when the control signal generation circuit 340 outputs the control signal PCON of a low level, the NMOS transistor NM13 is turned off, and so the supply of the ground voltage Vss to the output node E is cut off. The high voltage PMOS transistor HVPM is turned on, and so the high voltage VPP is supplied to the output node E. Accordingly, the block selection signal generator 350 outputs the block selection signal BLCWL of the high voltage (VPP) level.

According to the another exemplary embodiment of the present invention, the first and second address mixing signals XAXC<7;0> and XBXD<7;0> and the first and second enable period signals AB_EN and CD_EN for controlling the address mixing signals are used instead of the address signals XA<7;0>, XB<7;0>, XC<7;0>, and XD<7;0>. Accordingly, the area necessary to dispose some signal lines may be omitted.

In accordance with the exemplary embodiment of the present invention, the operation of the block decoder is controlled by using the first address mixing signal, generated using the first address signal and the second address signal, and the second address mixing signal, generated using the third address signal and the fourth address signal. Accordingly, the number of metal lines disposed beside the block decoder may decrease, and so the area of a semiconductor memory device may be reduced.

What is claimed is:

1. A block decoder of a semiconductor memory device, comprising:
   a control signal generation circuit configured to output a control signal in response to a first address mixing signal, a second address mixing signal, and an enable period signal; and
   a block selection signal generation circuit configured to generate a block selection signal for selecting a memory block in response to the control signal.

2. The block decoder of claim 1, wherein:
   the first address mixing signal is activated in a high level when at least any one of a first address signal and a second address signal is activated in a high level, and
   the second address mixing signal is activated in a high level when at least any one of a third address signal and a fourth address signal is activated in a high level.

3. The block decoder of claim 2, wherein the enable period signal comprise:
   a first enable period signal activated in a period in which the first address signal and the third address signal are activated; and
   a second enable period signal activated in a period in which the second address signal and the fourth address signal are activated.

4. The block decoder of claim 3, wherein the control signal generation circuit comprises:
   a first signal generator configured to generate a first signal in response to the first address mixing signal, the second address mixing signal, and the first enable period signal;
   a second signal generator configured to generate a second signal in response to the first address mixing signal, the second address mixing signal, and the second enable period signal; and
   a control signal output unit configured to generate the control signal in response to the first signal and the second signal.

5. The block decoder of claim 1, wherein the block signal generation circuit comprises a depletion high voltage NMOS transistor, a high voltage PMOS transistor, and an NMOS transistor which are coupled in series between a ground voltage node and a voltage supply node for supplying a high voltage.

6. The block decoder of claim 5, wherein:
   The depletion high voltage NMOS transistor configured to supply the high voltage to the high voltage PMOS transistor in response to the control signal, the high voltage PMOS transistor configured to raise an output node of the block selection signal generation circuit to a voltage level of the high voltage in response to the control signal, and the NMOS transistor configured to drop the output node of the block selection signal generation circuit to a ground voltage level in response to the control signal.

7. A block decoder of a semiconductor memory device, comprising:
- a first address activation signal generator configured to generate a first address activation signal in response to a first address mixing signal and a second address mixing signal;
- a second address activation signal generator configured to generate a second address activation signal in response to the first address mixing signal and a second address mixing signal;
- a control signal generator configured to generate a control signal in response to the first address activation signal and the second address activation signal; and
- a block selection signal generator configured to generate a block selection signal in response to the control signal.

8. The block decoder of claim 7, further comprising a reset unit configured to reset the first address activation signal to a low level in response to an enable signal.

9. The block decoder of claim 7, wherein:
the first address mixing signal is activated in a high level when at least any one of a first address signal and a second address signal is activated in a high level, and
the second address mixing signal is activated in a high level when at least any one of a third address signal and a fourth address signal is activated in a high level.

10. The block decoder of claim 9, wherein the first address activation signal generator is configured to generate the first address activation signal in response to the first address mixing signal, the second address mixing signal, and a first enable period signal.

11. The block decoder of claim 9, wherein the second address activation signal generator is configured to generate the second address activation signal in response to the first address mixing signal, the second address mixing signal, and a second enable period signal.

12. The block decoder of claim 10, wherein the first enable period signal is activated in a period in which the first address signal and the third address signal are activated.

13. The block decoder of claim 11, wherein the second enable period signal is activated in a period in which the second address signal and the fourth address signal are activated.

14. The block decoder of claim 10, wherein the first address activation signal generator comprises:
- a logic gate configured to generate an output signal in response to the first address mixing signal and the second address mixing signal;
- a transistor configured to transmit the output signal of the logic gate in response to the first enable period signal; and
- a latch configured to invert the output signal transmitted by the transistor and output an inverted signal as the first address activation signal.

15. The block decoder of claim 7, wherein the block selection signal generator comprises a depletion high voltage NMOS transistor, a high voltage PMOS transistor, and an NMOS transistor which are coupled in series between a ground voltage node and a voltage supply node for supplying a high voltage.

16. The block decoder of claim 15, wherein:
the depletion high voltage NMOS transistor configured to supply the high voltage to the high voltage PMOS transistor in response to the control signal,
the high voltage PMOS transistor configured to raise an output node of the block selection signal generation circuit to a voltage level of the high voltage in response to the control signal, and
the NMOS transistor configured to drop the output node of the block selection signal generation circuit to a ground voltage level in response to the control signal.

* * * * *